United States Patent
Chen et al.

(10) Patent No.: US 11,817,695 B2
(45) Date of Patent: Nov. 14, 2023

(54) PHASE-SELECTIVE INTERRUPTION FOR THREE-PHASE AC CIRCUITS WITH THOMSON COIL ACTUATED SWITCHES AND BREAKERS

(71) Applicant: EATON INTELLIGENT POWER LIMITED, Dublin (IE)

(72) Inventors: Steven Chen, Coraopolis, PA (US); Tyler Holp, Coraopolis, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 99 days.

(21) Appl. No.: 17/684,869

(22) Filed: Mar. 2, 2022

(65) Prior Publication Data
US 2023/0283064 A1 Sep. 7, 2023

(51) Int. Cl.
| | |
|---|---|
| H02H 3/16 | (2006.01) |
| H02J 3/00 | (2006.01) |
| H02H 3/033 | (2006.01) |
| H02H 3/08 | (2006.01) |
| G01R 19/175 | (2006.01) |

(52) U.S. Cl.
CPC .......... H02H 3/165 (2013.01); H02H 3/033 (2013.01); H02H 3/083 (2013.01); H02J 3/00125 (2020.01); G01R 19/175 (2013.01)

(58) Field of Classification Search
CPC ....... H02J 3/0012; H02H 3/033; H02H 3/083; H02H 3/165; G01R 19/175
See application file for complete search history.

(56) References Cited

U.S. PATENT DOCUMENTS

2022/0123589 A1* 4/2022 Fan ............... H02J 3/00125

FOREIGN PATENT DOCUMENTS

| CN | 1257336 A | * | 6/2000 |
| CN | 113949049 A | * | 1/2022 |
| KR | 20230045404 A | * | 4/2023 |

OTHER PUBLICATIONS

Robert Cheney, John Thorne, Greg Hataway; Distribution single-phase tripping and reclosing: Overcoming obstacles with programmable recloser controls; IEEE 62 Annual Conference for Protective Relay Engineers; Apr. 2, 2009, pp. 214-223. (Year: 2009).*

* cited by examiner

*Primary Examiner* — Harry R Behm
(74) *Attorney, Agent, or Firm* — Eckert Seamans Cherin & Mellott, LLC

(57) ABSTRACT

A system and method for interrupting power in a three-phase power system interrupts power in the faulted phase and the next sequential phase at high speeds, while interrupting power in the remaining phase at a normal operation speed. Limiting high-speed interruption to only two phases requires significantly less energy storage than implementing high-speed interruption in all three phases. When hybrid circuit interrupters are used, the need to wait for a zero-crossing in the current signal in order to initiate interruption operations is eliminated.

18 Claims, 3 Drawing Sheets

PHASE-SELECTIVE INTERRUPTION FOR THREE-PHASE AC CIRCUITS WITH THOMSON COIL ACTUATED SWITCHES AND BREAKERS

FIELD OF THE INVENTION

The disclosed concept relates generally to actuators used to open and close circuit interrupters, and in particular, to management of actuators used to open and close circuit interrupters in three-phase power systems.

BACKGROUND OF THE INVENTION

Circuit interrupters, such as for example and without limitation, circuit breakers and switches, are typically used to protect electrical circuitry from damage due to an overcurrent condition, such as an overload condition, a short circuit, or another fault condition, such as an arc fault or a ground fault. Circuit interrupters typically include separable electrical contacts, which operate as a switch. When the separable contacts are in contact with one another in a closed state, current is able to flow through any circuits connected to the circuit interrupter. When the separable contacts are not in contact with one another in an open state, current is prevented from flowing through any circuits connected to the circuit interrupter. The separable contacts may be operated either manually by way of an operator handle, remotely by way of an electrical signal, or automatically in response to a detected fault condition. Typically, such circuit interrupters include an actuator designed to rapidly close or open the separable contacts, and a trip mechanism, such as a trip unit, which senses a number of fault conditions to trip the separable contacts open automatically using the actuator. Upon sensing a fault condition, the trip unit trips the actuator to move the separable contacts to their open position.

Some circuit interrupters such as, for example, power circuit breakers, employ vacuum interrupters as switching devices. The separable electrical contacts usually included in vacuum interrupters are generally disposed on the ends of corresponding electrodes within an insulating housing that forms a vacuum chamber. Typically, one of the contacts is fixed relative to both the housing and to an external electrical conductor, which is electrically interconnected with a power circuit associated with the vacuum interrupter. The other contact is part of a movable contact assembly including an electrode stem of circular cross-section and a contact disposed on one end of the electrode stem and enclosed within a vacuum chamber. A driving mechanism is disposed on the other end, external to the vacuum chamber. When the trip unit detects a fault condition, the trip unit trips the actuator to cause the driving mechanism to open the separable contacts within the vacuum chamber. After the fault condition has resolved, the trip unit signals the actuator to cause the driving mechanism to drive the separable contacts closed within the vacuum chamber.

In medium and high voltage electrical systems in particular, the actuator of the circuit interrupter needs to be capable of driving the separable contacts open quickly in order to mitigate the effects of a fault condition. The efficacy of hybrid circuit interrupters in particular requires very fast opening of the mechanical separable contacts, as hybrid circuit interrupters use electronics to commutate current after the mechanical separable contacts are opened in order to reduce arcing, and the minimization of arcing depends on minimizing opening time. However, the force required to open the separable contacts quickly during high-speed operation is significant and requires much higher levels of stored energy than lower-speed interruption operations. Higher levels of energy storage incur greater space requirements and higher costs compared to lesser levels of energy storage.

There is thus room for improvement within actuators for circuit interrupters in power management systems.

SUMMARY OF THE INVENTION

These needs, and others, are met by a system and a method for interrupting power in a three-phase power system that facilitate interrupting power in the faulted phase and the next sequential phase at high speeds, while interrupting power in the remaining phase at normal speeds. By limiting high-speed interruption to only two phases, significantly less energy needs to be stored to power the high-speed interruption than if high-speed interruption were implemented in all three phases. In addition, when hybrid circuit interrupters are used, the need to wait for a zero-crossing in the current signal before initiating interruption operations is eliminated.

In accordance with one aspect of the disclosed concept, a phase-selective actuation arrangement for a three-phase power management system comprises: a first actuation mechanism connected to a first of three power phases, a second actuation mechanism connected to a second of three power phases, a third actuation mechanism connected to a third of three power phases, and a sensor and control module comprising a processor. The sensor and control module is configured to detect faults in each of the three power phases and to be in electrical communication with all of the actuation mechanisms. All of the actuation mechanisms are structured to interrupt a flow of power in their respective power phases when actuated. Upon detecting a fault in one of the three power phases, the sensor and control module is configured to actuate for high-speed operation the actuation mechanisms corresponding to the one power phase and to the next sequential power phase, and to actuate for normal operation the actuation mechanism corresponding to the remaining power phase.

In accordance with another aspect of the disclosed concept, a method for managing faults in a three-phase power system comprises: detecting a fault in one of three phases of power in the power system, identifying the one power phase in which the fault occurred and the next sequential phase, actuating high-speed interruption of power flow in the one phase and the next sequential power phase, and actuating normal interruption of power flow in the remaining power phase.

In accordance with one aspect of the disclosed concept, a three-phase power management system comprises a first circuit interrupter electrically connected to a first phase of power, a second circuit interrupter electrically connected to a second phase of power, a third phase of power electrically connected to a third phase of power, and a sensor and control module comprising a processor. Each of the circuit interrupters for each phase of power comprises: a number of conductors structured to connect an electrical load to a source of the phase of power; a number of sensors structured to sense power flowing in the number of conductors; a pair of separable contacts structured such that closing the separable contacts connects the load to the source and opening the separable contacts isolates the load from source; and an actuation mechanism operatively coupled to the separable contacts and structured to open and close the separable contacts. The sensor and control module is in electrical communication with the actuation mechanisms of all three phases of power and is configured to detect faults in each of the three phases based on signals sensed by the number of sensors. Each of the actuation mechanisms are structured to open the corresponding separable contacts when actuated. Upon detecting a fault in one of the three power phases, the sensor and control module is configured to actuate for high-speed operation the actuation mechanisms corresponding to the one power phase and to the next sequential power phase, and to actuate for normal operation the actuation mechanism corresponding to the remaining power phase.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
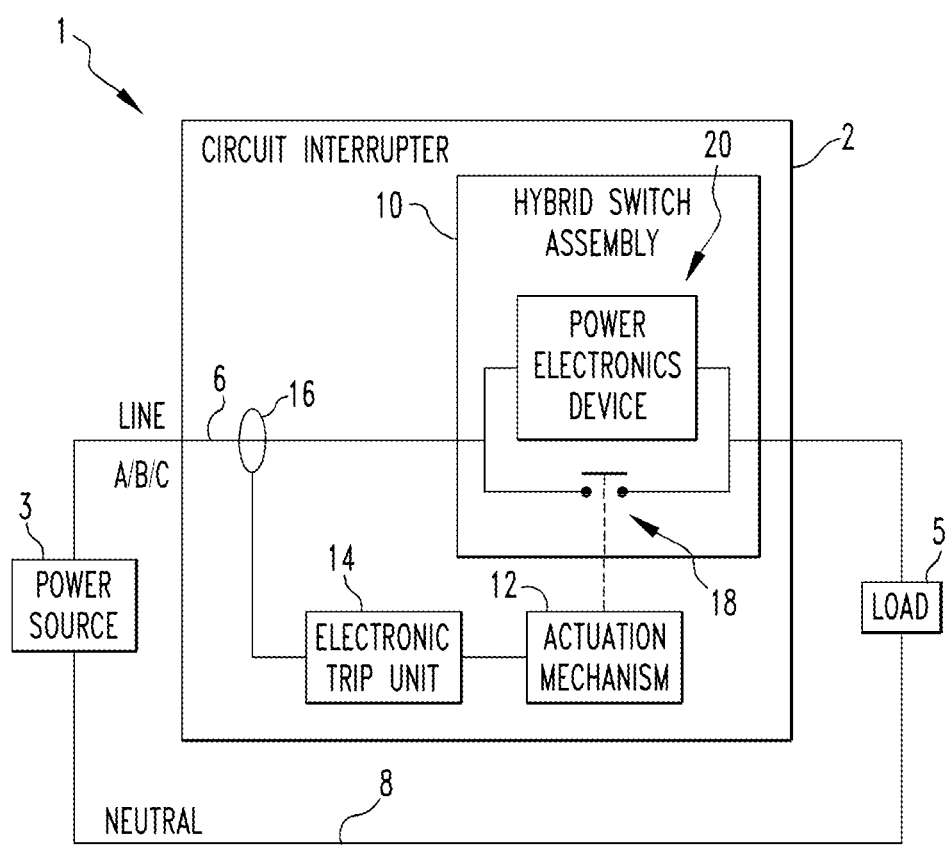
FIG. 1 is a schematic diagram of a power management arrangement for a single phase of power, in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, when ordinal terms such as "first" and "second" are used to modify a noun, such use is simply intended to distinguish one item from another, and is not intended to require a sequential order unless specifically stated.

As employed herein, the term "number" shall mean one or an integer greater than one (i.e., a plurality).

As employed herein, the term "processing unit" or "processor" shall mean a programmable analog and/or digital device that can store, retrieve, and process data; a microprocessor; a microcontroller; a microcomputer; a central processing unit; or any suitable processing device or apparatus.

FIG. 1 is a schematic diagram of a power management arrangement 1 for a single phase of power, in accordance with an example embodiment of the disclosed concept. The power management arrangement 1 comprises a circuit interrupter 2 (e.g., without limitation, a circuit breaker or switch) that is structured to be electrically connected between a power source 3 and a load 5 via line and neutral conductors 6, 8. The circuit interrupter 2 is structured to trip open or switch open to interrupt current flowing between the power source 3 and load 5 in the event of a fault condition (e.g., without limitation, an overcurrent condition) to protect the load 5, circuitry associated with the load 5, as well as the power source 3. In a three-phase power management system, each phase of power (i.e. A, B, or C) has its own designated power management arrangement 1 such that three arrangements of the type shown in FIG. 1 are used for the entire three-phase power management system.

In exemplary embodiments of the disclosed concept, the circuit interrupter 2 is more specifically a hybrid circuit interrupter that includes a hybrid switch assembly 10, an actuation mechanism 12, and an electronic trip unit 14. The electronic trip unit 14 is structured to monitor power flowing through the circuit interrupter 2 via a current sensor 16 and/or other sensors and to detect fault conditions based on the power flowing through the circuit interrupter 2. In response to detecting a fault condition, the electronic trip unit 14 is structured to output a signal to the actuation mechanism 12, which is structured to open a set of mechanical separable contacts 18 in the hybrid switch assembly 10 in order to interrupt current flowing through the circuit interrupter 2 in response to the signal from the electronic trip unit 14.

The hybrid switch assembly 10 in FIG. 1 is a simplified depiction of a hybrid switch intended to explain how current commutates past mechanical separable contacts in a hybrid switch, and is not intended to be limiting on the different types of hybrid switch assemblies that can be included in circuit interrupter 2. As previously stated, hybrid switch assembly 10 includes a pair of separable mechanical contacts 18. When the separable contacts 18 are in a closed state such that they are in contact with one another, current flows through the line conductor 6 and the separable contacts 18 to the load 5. When electronic trip unit 14 outputs a signal to the actuating mechanism 12 to initiate a trip, the actuating mechanism 12 actuates to physically separate the separable contacts 18. The power electronics device 20 is configured to turn on as the separable contacts 18 open, i.e. separate. When the power electronics device 20 is turned on, current is able to commutate past the open separable contacts 18 by flowing through the line conductor 6 and the power electronics device 20. The power electronics device is configured to remain powered on only for a very short time such that the line connection between the power source 3 and the load 5 is broken shortly after the current is commutated. By enabling current to commutate past the separable contacts 18 through power electronic device 20 for a very limited time before the connection between the power source 3 and load 5 is completely opened, the effects of arcing are reduced. The hybrid switch assembly 10 can additionally include an energy absorbing device, for example and without limitation, a surge arrester. It will be appreciated that the inclusion of hybrid switch assembly 10 in circuit interrupter 2 can eliminate the need for current zero-crossing as a condition of circuit interruption.

Figure 2:
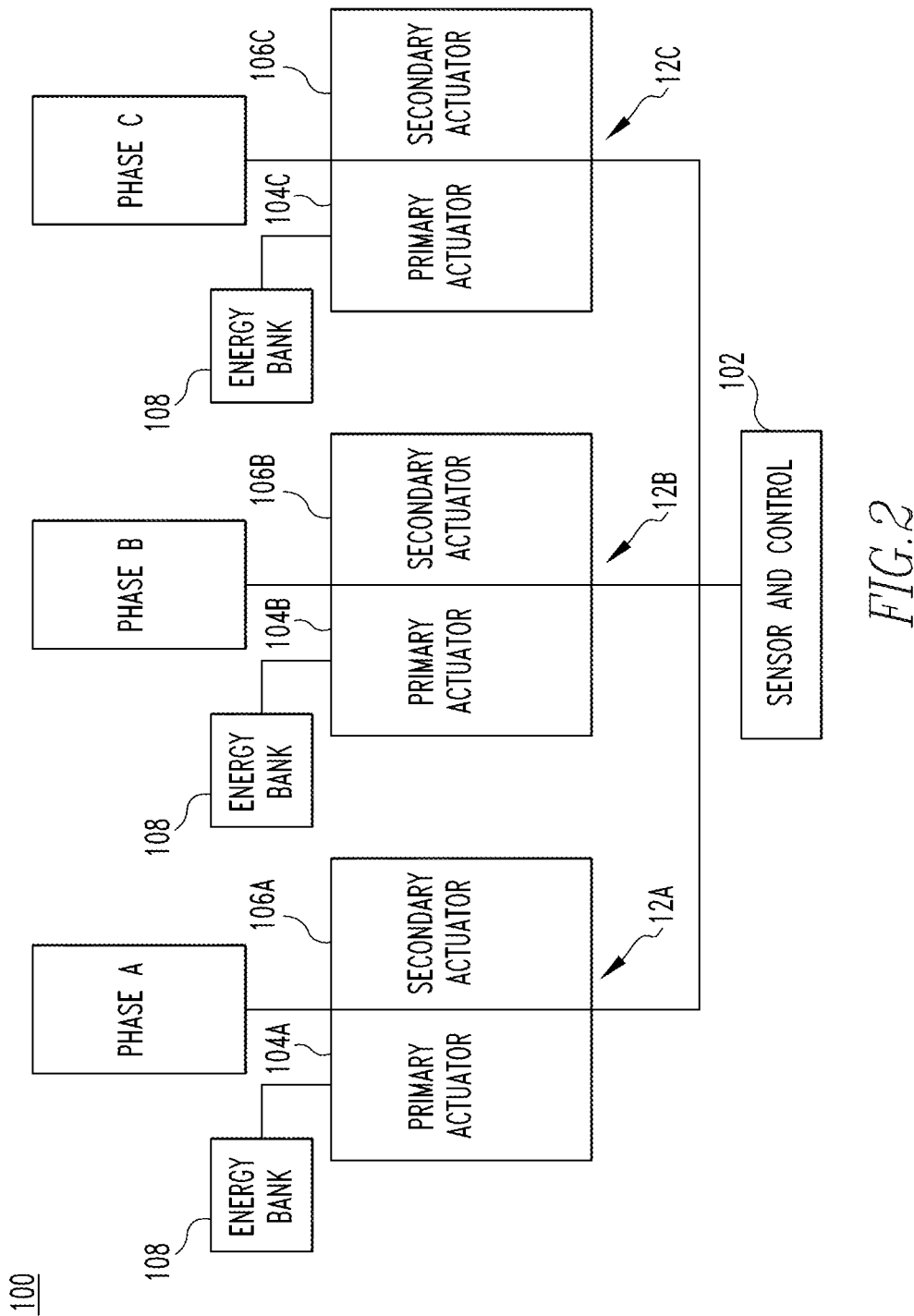
FIG. 2 is a schematic diagram of a phase-selective actuation arrangement for use in a three-phase power management system comprising components of the single phase power management arrangement shown in FIG. 1, in accordance with an example embodiment of the disclosed concept.

Referring now to FIG. 2 in conjunction with FIG. 1, a simplified schematic depiction of a phase-selective actuation arrangement 100 for a three-phase power management system is shown, in accordance with an example embodiment of the disclosed concept. For simplicity, most of the components of a circuit interrupter 2 depicted in FIG. 1 that would be connected to each phase of power in the three-phase system are not shown in FIG. 2, however, it should be understood that each power phase A, B, and C shown in FIG. 2 has a circuit interrupter 2 connected, and that the actuation mechanism 12A, 12B, or 12C shown for each phase in FIG. 2 is a component of said circuit interrupter 2.

The phase-selective actuation arrangement 100 shown in FIG. 2 includes a sensor and control module 102 comprising a processor that is in electrical communication with all three phases of power A, B, and C. Sensor and control module 102 can, for example and without limitation, be included in a centralized power system control (as depicted in FIG. 2) or can be decentralized such that the trip unit 14 of each power phase comprises a sensor and control module 102 that is in communication with the sensor and control module 102 of the other power phases in the system. In addition, sensor and control module is in electrical communication with current sensor 16 and/or any other sensors included in circuit interrupter 2 for detecting faults.

As shown in FIG. 2, the actuation mechanism 12A, 12B, or 12C connected to each phase of power comprises two distinct actuators, a primary actuator 104 and a secondary actuator 106, each of which is electrically connected to the sensor and control module 102 and operatively coupled to the separable contacts 18. The actuation mechanisms 12A, 12B, and 12C may be referred to collectively or generally as "actuation mechanism[s] 12". The primary actuators 104A, 104B, and 104C may be referred to collectively or generally as "primary actuator[s] 104", and the secondary actuators 106A, 106B, and 106C may be referred to collectively or generally as "secondary actuator[s] 106". The use of the letter 'A', '13', or 'C' in the reference numbers of each of these components solely denotes a connotation with the corresponding power phase A, B, or C, and it will be appreciated that similarly numbered components each operate in a functionally equivalent manner in their respective phases.

Still referring to FIG. 2, sensor and control module 102 is configured to selectively activate the primary actuator 104 for a given phase when high-speed actuation of the circuit interrupter 2 is required for that phase, and is configured to selectively activate the secondary actuator 106 when normal operation (i.e. actuation at normal speeds) of the circuit interrupter 2 is sufficient for that phase. As used herein, the term "high[-] speed" should be understood to denote speeds that result in interrupting a flow of power through a three-phase circuit in about 1 to 20 milliseconds. As used herein, the terms "normal", "normal operation", or "normal speed" should be understood to denote actuator speeds that would result in interrupting a flow of power through a three-phase circuit in about 40 to 60 milliseconds if the actuators for all three phases were operating at said "normal" speed. Accordingly, the primary actuator 104 can also be referred to as the "high-speed actuator 104" and the secondary actuator 106 can also be referred to as the "normal operation actuator 106". The circumstances dictating whether high-speed or normal operation should be chosen are detailed later herein with respect to method 200 depicted in FIG. 3. A primary actuator 104 can comprise, for example and without limitation a Thomson coil actuator or other type of actuator capable of high-speed actuation. A secondary actuator 106 can comprise, for example and without limitation, a solenoid or other type of electromagnetic actuator. The primary actuators 104 are all electrically connected to the same single stored energy bank 108. Energy bank 108 can comprise, for example and without limitation, a capacitor bank.

Figure 3:
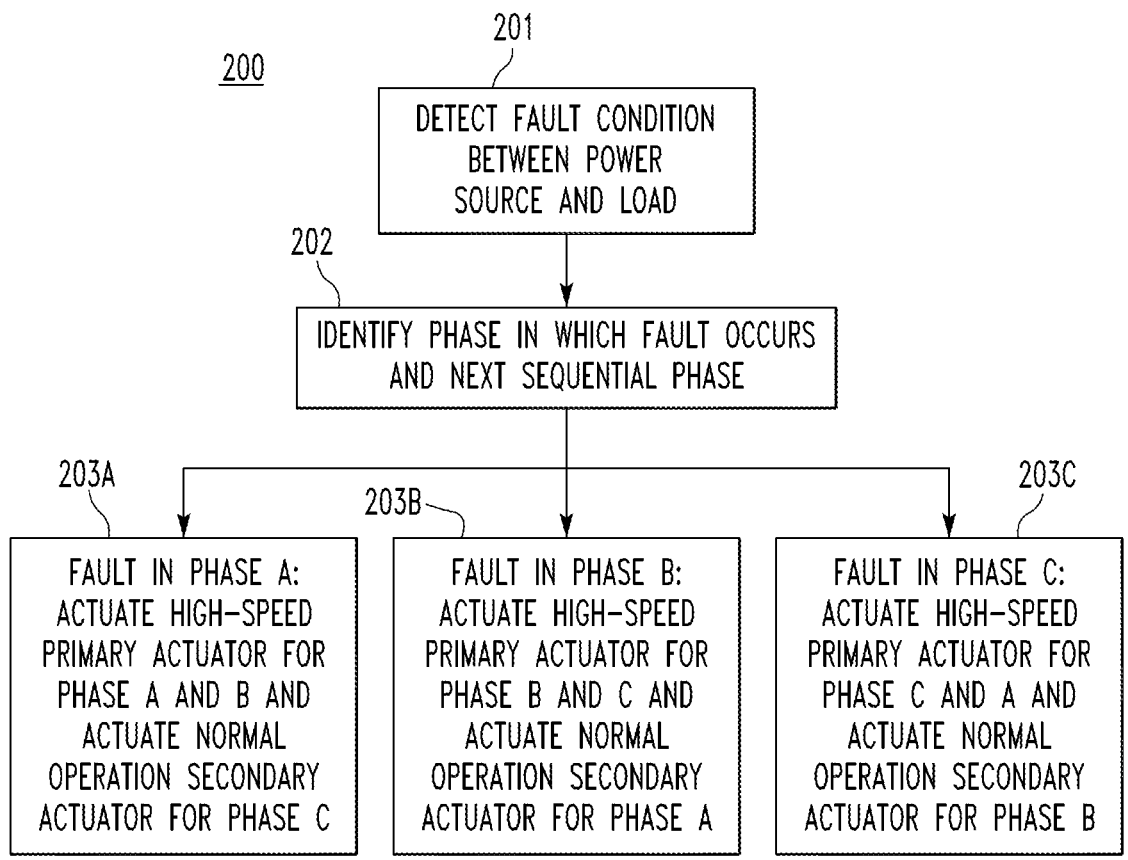
FIG. 3 is a flow chart of a method for managing faults in a three-phase power system by selectively activating high-speed and normal operations of circuit interrupters on a phase-by-phase basis, in accordance with an example embodiment of the disclosed concept.

Referring now to FIG. 3, a flow chart of a method 200 for managing faults in a three-phase power system is shown, in accordance with an example embodiment of the disclosed concept. The method is directed toward selectively activating high and normal speed actuation operations of circuit interrupters on a phase-by-phase basis. The method of FIG. 3 may be employed, for example, with the circuit interrupter 2 and phase-selective actuation arrangement 100 shown in FIG. 1 and FIG. 2. However, it will be appreciated that the method may be employed with other systems as well without departing from the scope of the disclosed concept. It will be appreciated that the trip unit 14 of each circuit interrupter 2 in each power phase continuously monitors the line and load conductors 6, 8 of the phase, and the method 200 starts at step 201 when the sensor and control module 102 detects a fault in one of the power phases. At step 202, the sensor and control module 102 identifies the phase in which the fault occurred and the next sequential phase. It will be appreciated that, with respect to a given power phase in a three-phase power system, the term "next sequential phase" refers to the phase whose current signal lags that of the given power phase by 120 degrees.

The method then proceeds to step 203A if the fault occurred in phase A, to step 203B if the fault occurred in phase B, or to step 203C if the fault occurred in phase C. At step 203A, the sensor and control module 102 actuates the primary actuator 104 in phase A and phase B for high-speed actuation and opening of the separable contacts 18 in both of those phases, and actuates the secondary actuator 106 in phase C for normal actuation (i.e. at normal speeds) and opening of the separable contacts 18 in phase C. Similarly, at step 203B, the sensor and control module 102 actuates the primary actuator 104 in phase B and phase C for high-speed actuation and opening of the separable contacts 18 in both of those phases, and actuates the secondary actuator 106 in phase A for normal actuation (i.e. at normal speeds) and opening of the separable contacts 18 in phase A. Likewise, at step 203C, the sensor and control module 102 actuates the primary actuator 104 in phase C and phase A for high-speed actuation and opening of the separable contacts 18 in both of those phases, and actuates the secondary actuator 106 in phase B for normal actuation (i.e. at normal speeds) and opening of the separable contacts 18 in phase B.

In principle, interrupting any two of the three phases of a three-phase AC circuit effectively interrupts all three phases. By only interrupting the phase in which the fault occurs and the next sequential phase at high speeds, the system and method detailed herein require significantly less energy storage than systems and methods that interrupt all three phases at high speeds. Systems using the three-phase power management system 100 have been shown to interrupt the flow of power through three-phase circuits in about 1 to 20 milliseconds. The energy bank 108 only needs to store approximately two-thirds of the energy that it would need to store if high-speed interruption were used for all three phases of power. It will be appreciated that a one-third decrease in energy consumption is significant, and that a one-third decrease in energy holds greater significance as switches or circuit breakers with higher ratings are considered. Implementing high-speed operation for only two poles during fault current interruption instead of three poles results in the system detailed herein having a smaller size and lesser cost, as well as improved energy efficiency and higher power density.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A phase-selective actuation arrangement for a three-phase power management system, the phase-selective actuation arrangement comprising:
   a first actuation mechanism connected to a first of three power phases; a second actuation mechanism connected to a second of three power phases;
   a third actuation mechanism connected to a third of three power phases; and
   a sensor and control module comprising a processor, the sensor and control module being configured to detect faults in each of the three power phases and to be in electrical communication with all of the actuation mechanisms,
   wherein all of the actuation mechanisms are structured to interrupt a flow of power in their respective power phases when actuated,
   wherein, upon detecting a fault in one of the three power phases, the sensor and control module is configured to actuate for high-speed operation the actuation mechanisms corresponding to the one power phase and to the next sequential power phase, and to actuate for normal operation the actuation mechanism corresponding to the remaining power phase.

2. The actuation arrangement of claim 1,
   wherein each of the actuation mechanisms comprises a high-speed actuator and a normal operation actuator,
   wherein, upon detecting the fault, the sensor and control module is configured to selectively actuate the high-speed actuator corresponding to the one power phase and the next sequential power phase, and
   wherein, upon detecting the fault, the sensor and control module is configured to selectively actuate the normal operation actuator corresponding to the remaining power phase.

3. The actuation arrangement of claim 2,
   wherein the high-speed actuator of each actuation mechanism comprises a Thomson coil actuator, and
   wherein the normal operation actuator comprises a solenoid.

4. The actuation arrangement of claim 2, further comprising:
   a stored energy bank;
   wherein the high-speed actuator of each of the actuation mechanism is electrically connected to the stored energy bank.

5. The actuation arrangement of claim 4,
   wherein the stored energy bank comprises a capacitor bank.

6. The actuation arrangement of claim 4,
   wherein the stored energy bank is structured to store an amount of energy sufficient to interrupt two of the three power phases at high speed but less than an amount of energy sufficient to interrupt all three power phases at high speed.

7. A method for managing faults in a three-phase power system, the method comprising:
   detecting a fault in one of three phases of power in the power system;
   identifying the one power phase in which the fault occurred and the next sequential phase;
   actuating high-speed interruption of power flow in the one phase and the next sequential power phase; and
   actuating normal interruption of power flow in the remaining power phase.

8. The method of claim 7,
   wherein actuating high-speed interruption comprises selectively actuating high-speed actuators connected to the one phase and to a next sequential power phase of the one power phase, and
   wherein actuating normal interruption comprises selectively actuating a normal operation actuator connected to the remaining power phase.

9. The method of claim 8,
   wherein each of the high-speed actuators comprises a Thomson coil actuator, and
   wherein the normal operation actuator comprises a solenoid.

10. The method of claim 8,
    further comprising powering the high-speed actuators with a stored energy bank.

11. The method of claim 10,
    wherein the stored energy bank comprises a capacitor bank.

12. The method of claim 10,
    further comprising charging the energy bank with an amount of energy sufficient to interrupt two of the three power phases at high speed but less than an amount of energy sufficient to interrupt all three power phases at high speed.

13. A three-phase power management system, the power management system comprising:
    a first circuit interrupter connected to a first power phase, a second circuit interrupter connected to a second power phase, and a third circuit interrupter connected to a third power phase, each of the circuit interrupters for each phase of power comprising:
       a number of conductors structured to connect an electrical load to a source of the phase of power;
       a number of sensors structured to sense power flowing in the number of conductors;
       a pair of separable contacts structured such that closing the separable contacts connects the load to the source and opening the separable contacts isolates the load from source; and
       an actuation mechanism operatively coupled to the separable contacts and structured to open and close the separable contacts; and
    a sensor and control module comprising a processor, the sensor and control module being in electrical communication with the actuation mechanisms of all three phases of power and being configured to detect faults in each of the three phases based on signals sensed by the number of sensors,
    wherein each of the actuation mechanisms are structured to open the corresponding separable contacts when actuated,
    wherein, upon detecting a fault in one of the three power phases, the sensor and control module is configured to actuate for high-speed operation the actuation mechanisms corresponding to the one power phase and to the next sequential power phase, and to actuate for normal operation the actuation mechanism corresponding to the remaining power phase.

14. The power management system of claim 13,
    wherein each of the actuation mechanisms comprises a high-speed actuator and a normal operation actuator,
    wherein, upon detecting the fault, the sensor and control module is configured to selectively actuate the high-speed actuator corresponding to the one power phase and the next sequential power phase, and wherein, upon detecting the fault, the sensor and control module is configured to selectively actuate the normal operation actuator corresponding to the remaining power phase.

15. The power management system of claim 14, wherein the high-speed actuator of each actuation mechanism comprises a Thomson coil actuator, and wherein the normal operation actuator comprises a solenoid.

16. The power management system of claim 14, further comprising:

a stored energy bank;

wherein the high-speed actuator of each of the actuation mechanism is electrically connected to the stored energy bank.

17. The power management system of claim 16, wherein the stored energy bank comprises a capacitor bank.

18. The power management system of claim 16, wherein the stored energy bank is structured to store an amount of energy sufficient to interrupt two of the three power phases at high speed but less than an amount of energy sufficient to interrupt all three power phases at high speed.

* * * * *